(12) United States Patent
Kim et al.

(10) Patent No.: US 11,997,901 B2
(45) Date of Patent: May 28, 2024

(54) DISPLAY APPARATUS HAVING GROOVED TERMINALS

(71) Applicant: SAMSUNG DISPLAY CO., LTD., Yongin-si (KR)

(72) Inventors: Byoungyong Kim, Yongin-si (KR); Seunghwa Ha, Yongin-si (KR); Seungsoo Ryu, Yongin-si (KR); Sanghyeon Song, Yongin-si (KR); Jeongdo Yang, Yongin-si (KR); Jungyun Jo, Yongin-si (KR); Jeongho Hwang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/162,136

(22) Filed: Jan. 31, 2023

(65) Prior Publication Data
US 2023/0172021 A1 Jun. 1, 2023

Related U.S. Application Data

(60) Continuation of application No. 17/115,744, filed on Dec. 8, 2020, now Pat. No. 11,605,697, which is a
(Continued)

(30) Foreign Application Priority Data
Jun. 21, 2016 (KR) .......................... 10-2016-0077556

(51) Int. Cl.
H10K 59/13 (2023.01)
G02F 1/13 (2006.01)
(Continued)

(52) U.S. Cl.
CPC ....... H10K 59/131 (2023.02); G02F 1/13458 (2013.01); H05K 1/111 (2013.01);
(Continued)

(58) Field of Classification Search
CPC ............ H10K 50/844; H10K 50/8423; H10K 59/131; H10K 59/179; H05K 1/111;
(Continued)

(56) References Cited

U.S. PATENT DOCUMENTS 4,293,637 A    10/1981   Hatada et al.
6,259,118 B1   7/2001    Ahn et al.
(Continued)

FOREIGN PATENT DOCUMENTS

CN    102569092    7/2012
CN    204287637    4/2015
(Continued)

OTHER PUBLICATIONS

Extended European Search Report dated Nov. 13, 2017 for European Application No. 17176523.3.
(Continued)

Primary Examiner — Ida M Soward
(74) Attorney, Agent, or Firm — F. CHAU & ASSOCIATES, LLC

(57) ABSTRACT

A display apparatus includes a display panel having a display substrate on which a plurality of pad terminals is disposed, and a driving unit having a plurality of driving terminals electrically connected to the plurality of pad terminals. Each of the plurality of pad terminals includes a stepped groove that faces a corresponding driving terminal of the plurality of driving terminals or each of the plurality of pad terminals includes an opening hole that faces the corresponding driving terminal of the plurality of driving terminals.

8 Claims, 12 Drawing Sheets

Related U.S. Application Data continuation of application No. 16/267,003, filed on Feb. 4, 2019, now Pat. No. 10,879,335, which is a division of application No. 15/362,082, filed on Nov. 28, 2016, now Pat. No. 10,217,806.

(51) Int. Cl.
*G02F 1/1345* (2006.01)
*H05K 1/11* (2006.01)
*H05K 3/32* (2006.01)
*H10K 50/844* (2023.01)
*H10K 59/131* (2023.01)
*H10K 71/00* (2023.01)

(52) U.S. Cl.
CPC ............... *H05K 1/112* (2013.01); *H05K 3/32* (2013.01); *H05K 3/328* (2013.01); *H10K 50/844* (2023.02); *H10K 71/00* (2023.02); *H05K 2201/0373* (2013.01); *H05K 2201/09845* (2013.01); *H05K 2203/0285* (2013.01); *Y02P 70/50* (2015.11)

(58) Field of Classification Search
CPC ............ H05K 1/112; H05K 3/32; H05K 2201/09845; G02F 1/13458; H01L 27/124; H01L 2924/12044
See application file for complete search history.

(56) References Cited

U.S. PATENT DOCUMENTS

| | | | |
|---|---|---|---|
| 6,259,119 B1 | 7/2001 | Ahn et al. | |
| 6,288,414 B1 | 9/2001 | Ahn | |
| 6,373,544 B1 | 4/2002 | Hirabayashi | |
| 6,656,008 B2 | 12/2003 | Oh et al. | |
| 6,958,743 B2 | 10/2005 | Shin et al. | |
| 7,723,166 B2 | 5/2010 | Salmon | |
| 7,750,469 B2 | 7/2010 | Cho et al. | |
| 7,964,877 B2 | 6/2011 | Yoon et al. | |
| 8,203,134 B2 | 6/2012 | Liu | |
| 8,288,230 B2 | 10/2012 | Weber et al. | |
| 8,461,679 B2* | 6/2013 | Lee | H01L 25/50 257/737 |
| 8,614,544 B2 | 12/2013 | Suzuki et al. | |
| 8,866,162 B2 | 10/2014 | Kang et al. | |
| 8,981,576 B2* | 3/2015 | Yu | H01L 23/49811 257/781 |
| 8,987,132 B2 | 3/2015 | Gruber et al. | |
| 9,412,726 B2 | 8/2016 | Asaka | |
| 9,640,600 B2 | 5/2017 | Oooka et al. | |
| 10,217,806 B2 | 2/2019 | Kim et al. | |
| 10,242,968 B2* | 3/2019 | Das | H01L 21/02282 |
| 10,879,335 B2 | 12/2020 | Kim et al. | |
| 2003/0122762 A1 | 7/2003 | Shin et al. | |
| 2004/0135940 A1 | 7/2004 | Tsunekawa et al. | |
| 2004/0140515 A1 | 7/2004 | Yusukawa | |
| 2004/0179165 A1 | 9/2004 | Kinoshita et al. | |
| 2006/0206828 A1 | 9/2006 | Lee et al. | |
| 2007/0176563 A1 | 8/2007 | Kim et al. | |
| 2007/0290619 A1 | 12/2007 | Kang | |
| 2008/0111492 A1 | 5/2008 | Kwak et al. | |
| 2009/0273078 A1* | 11/2009 | Amin | H05K 1/0271 257/737 |
| 2009/0315459 A1 | 12/2009 | Kwon et al. | |
| 2010/0007282 A1 | 1/2010 | Yamamoto | |
| 2012/0252168 A1* | 10/2012 | Nah | H01L 21/4853 257/E21.502 |
| 2012/0306104 A1 | 12/2012 | Choi et al. | |
| 2013/0161609 A1 | 6/2013 | Koyama | |
| 2013/0292819 A1 | 11/2013 | Huang et al. | |
| 2013/0293816 A1 | 11/2013 | Jung et al. | |
| 2014/0057392 A1* | 2/2014 | Nah | H01L 21/563 438/615 |
| 2014/0065771 A1* | 3/2014 | Gruber | H05K 3/3436 257/E21.506 |
| 2015/0002491 A1 | 1/2015 | Lee et al. | |
| 2015/0228706 A1 | 8/2015 | Lee | |
| 2015/0237726 A1 | 8/2015 | Shin et al. | |
| 2015/0287707 A1 | 10/2015 | Asaka | |
| 2016/0052081 A1 | 2/2016 | Regenberg | |
| 2016/0056430 A1 | 2/2016 | Burkman | |
| 2016/0161818 A1 | 6/2016 | Gregard et al. | |
| 2016/0313818 A1 | 10/2016 | Kim et al. | |
| 2017/0149213 A1 | 6/2017 | Tazawa et al. | |
| 2017/0334711 A1 | 11/2017 | Chang et al. | |
| 2017/0365653 A1 | 12/2017 | Kim et al. | |
| 2019/0172896 A1 | 6/2019 | Kim et al. | |
| 2021/0118973 A1 | 4/2021 | Kim et al. | |

FOREIGN PATENT DOCUMENTS

| | | | |
|---|---|---|---|
| CN | 104900674 | 9/2015 | |
| JP | H0917824 A * | 1/1997 | ... H01L 2924/16152 |
| JP | 2005-166960 | 6/2005 | |
| JP | 2007-059916 | 3/2007 | |
| JP | 2008-160168 | 7/2008 | |
| JP | 4327220 | 6/2009 | |
| JP | 2015-20075 | 11/2015 | |
| KR | 10-1998-0072407 A | 11/1998 | |
| KR | 10-2003-0057695 A | 7/2003 | |
| KR | 10-2006-0072767 | 6/2006 | |
| KR | 10-2013-0124876 | 11/2013 | |
| KR | 10-2015-0094829 | 8/2015 | |

OTHER PUBLICATIONS

Frank Balle, et al., "Ultrasonic Metal Welding of Aluminum Sheets to Carbon Fibre Reinforced Thermoplastic Composites," Advanced Engineering Materials 2009, 11, No. 1-2, pp. 35-39.

\* cited by examiner

DISPLAY APPARATUS HAVING GROOVED TERMINALS

CROSS-REFERENCE TO RELATED APPLICATION

This application is a Continuation of U.S. patent application Ser. No. 17/115,744, filed on Dec. 8, 2020, which is a Continuation of Ser. No. 16/267,003, filed on Feb. 4, 2019 (issued on Dec. 29, 2020 as U.S. Pat. No. 10,879,335), which is a Division of U.S. patent application Ser. No. 15/362,082, filed on Nov. 28, 2016 (issued on Feb. 26, 2019 as U.S. Pat. No. 10,217,806), which claims priority to, and the benefit of, Korean Patent Application No. 10-2016-0077556, filed on Jun. 21, 2016, in the Korean Intellectual Property Office, the disclosures of which are incorporated by reference herein in their entirety.

TECHNICAL FIELD

Exemplary embodiments of the present invention relate to display apparatuses, and more particularly, to display apparatuses having grooved terminals and methods of manufacturing the same.

DISCUSSION OF THE RELATED ART

Display apparatuses can be found within all sorts of devices such as smartphones, laptop computers, digital cameras, camcorders, portable information terminal devices, notebooks, tablet personal computers (PCs), and other such mobile devices. Display apparatuses are also found in stationary electronic apparatuses, such as desktop computers, televisions (TVs), outdoor billboards, display apparatuses for exhibition, and the like. In these display apparatuses, it is common to use pad terminals on a display substrate and driving terminals on a driver. The display substrate may then be electrically connected to the driver by connecting the pad terminals to the driving terminals.

Often, an anisotropic conductive film is interposed between each of the pad terminals and each of the driving terminals so that each of the pad terminals and each of the driving terminals can be coupled to each other. However, the use of this anisotropic conductive film may render the connection between the pad terminals and the driving terminals electrically unstably.

SUMMARY

Exemplary embodiments of the present invention provide display apparatuses in which there is a stable electrical coupling between each pad terminal and each driving terminal. Exemplary embodiments of the present invention further provide methods of manufacturing display apparatuses such as these.

A display apparatus includes a display panel comprising a display substrate on which a plurality of pad terminals is disposed, and a driving unit comprising a plurality of driving terminals electrically connected to the plurality of pad terminals. Each of the plurality of pad terminals includes a stepped groove that faces a corresponding driving terminal of the plurality of driving terminals or each of the plurality of pad terminals includes an opening hole that faces the corresponding driving terminal of the plurality of driving terminals.

A display apparatus includes a display panel including a display substrate. A plurality of pad terminals is disposed on the display substrate. A driving unit includes a plurality of driving terminals electrically connected to the plurality of pad terminals. Each of the plurality of driving terminals includes a stepped groove partially penetrating each of the plurality of driving terminals or an opening hole fully penetrating each of the plurality of driving terminals.

A display apparatus includes a display panel. The display panel includes a display substrate on which a plurality of pad terminals is disposed. A thin film encapsulation (TFE) layer is disposed on the display substrate. A driving unit includes a plurality of driving terminals electrically connected to the plurality of pad terminals. A first stepped groove partially penetrates each of the plurality of pad terminals or a first opening hole fully penetrates each of the plurality of pad terminals. Each of the plurality of driving terminals includes a second stepped groove partially penetrating each of the plurality of driving terminals or a second opening hole fully penetrating each of the plurality of driving terminals.

A method of manufacturing a display apparatus includes forming a stepped groove partially penetrating a pad terminal, forming a stepped groove partially penetrating a driving terminal, forming an opening hole fully penetrating the pad terminal, or forming an opening hole fully penetrating the driving terminal. The pad terminal and the driving terminal contact each other. Pressure is applied to the pad terminal or the driving terminal to squeeze the pad terminal and the driving terminal together. Part of the pad terminal and part of the driving terminal are inserted into the stepped groove or the opening hole formed in the pad terminal or the driving terminal. The pad terminal and the driving terminal are vibrated. The pad terminal and the driving terminal are connected to each other using ultrasound bonding, while the pad terminal and the driving terminal are being vibrated. A connection portion that electrically connects the pad terminal and the driving terminal is formed.

An electronic device includes a display apparatus. The display apparatus includes a display panel having at least one pad terminal disposed thereon. A display driver has at least one driving terminal disposed thereon. The driving terminal is connected to the pad terminal. A first cutout is formed in the pad terminal or a second cutout is formed in the driving terminal. A connection portion is disposed between the pad terminal and the driving terminal. The connection portion includes a mixing of a first material from the pad terminal and a second material from the driving terminal.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
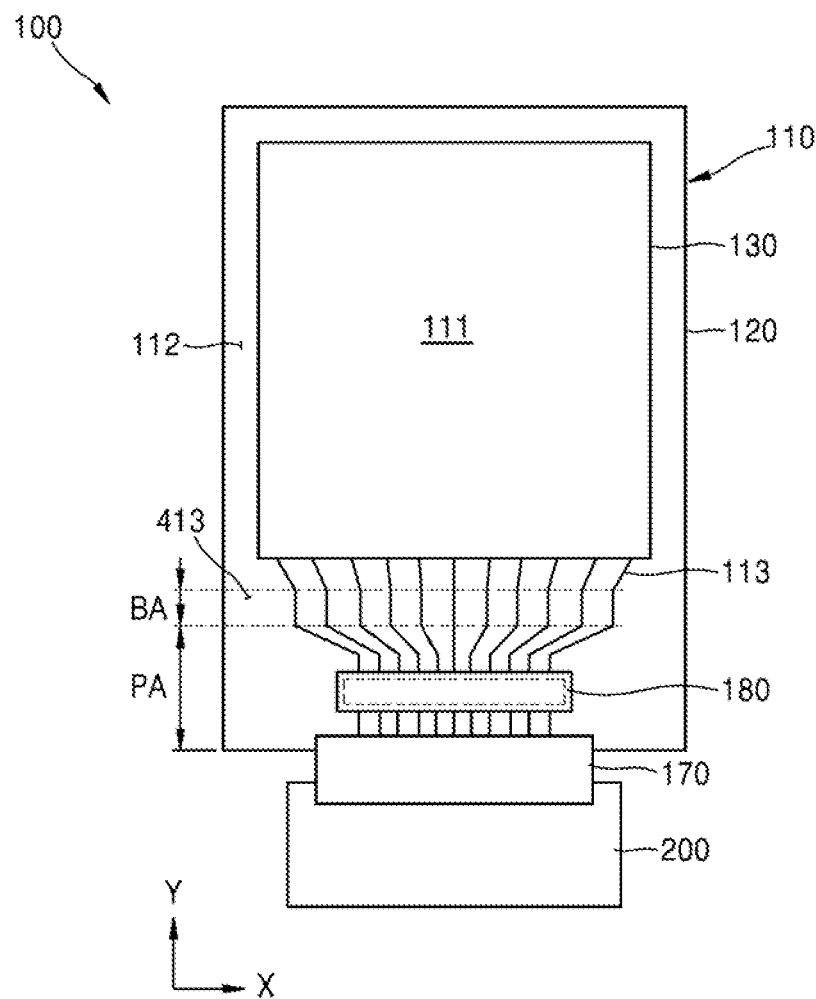
FIG. 1 is a plan view of a display apparatus according to an exemplary embodiment of the present invention.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

While such terms as "first," "second," etc., in the following embodiments may be used to describe various components, these components should not be limited by these terms. These terms are only used to distinguish one component from another.

Sizes of elements in the drawings may be exaggerated or reduced for convenience of explanation.

Exemplary embodiments of the present invention will be described below in more detail with reference to the accompanying drawings. In the figures, elements having the same reference numeral may be similar to or identical to each other.

Figure 2:
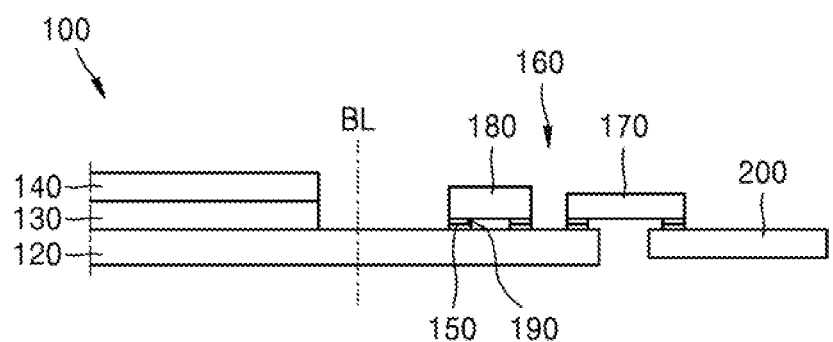
FIG. 2 is a cross-sectional view of the display apparatus illustrated in FIG. 1.
Figure 3:
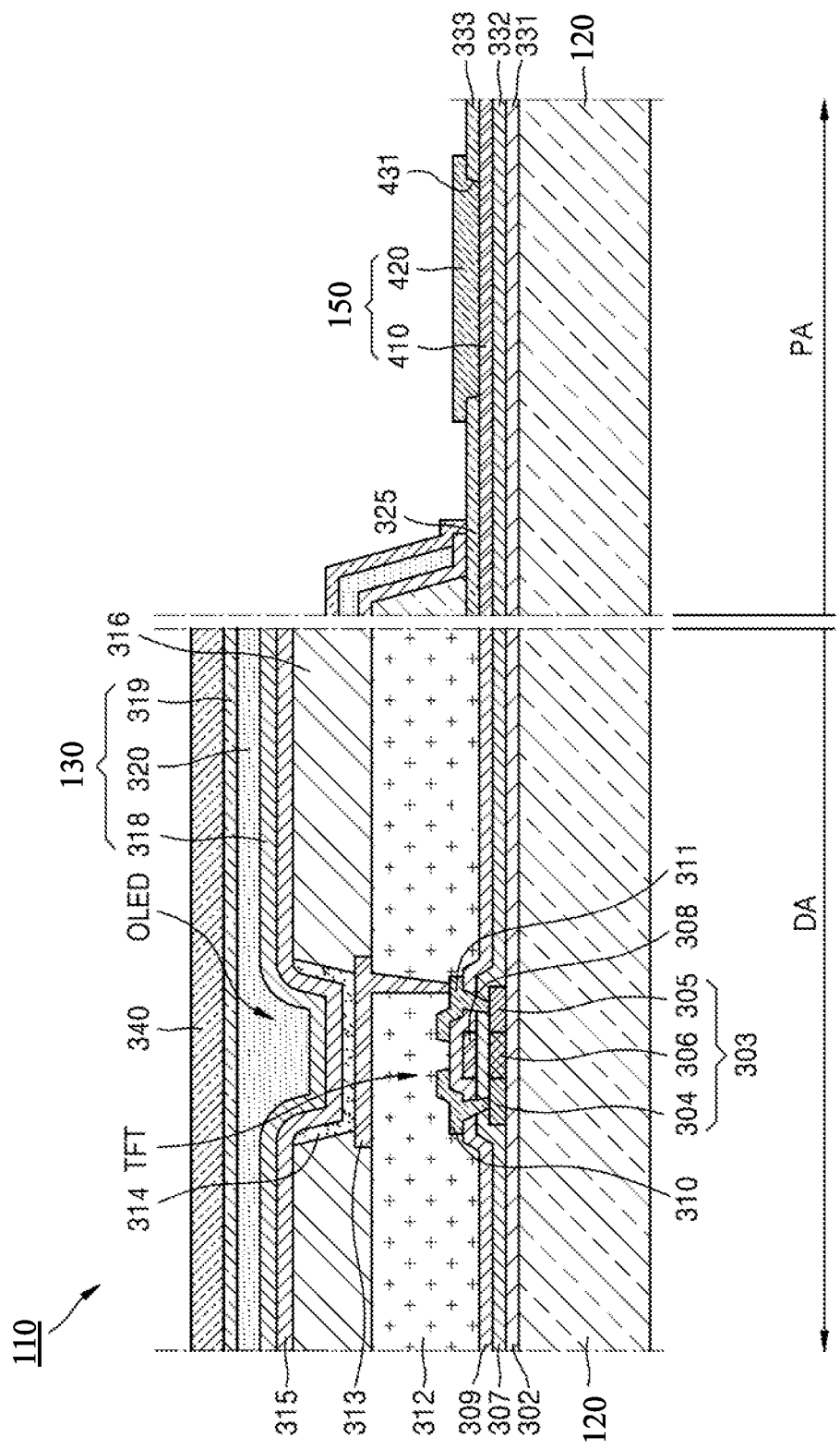
FIG. 3 is a cross-sectional view of a display panel according to an exemplary embodiment of the present invention.
Figure 4:
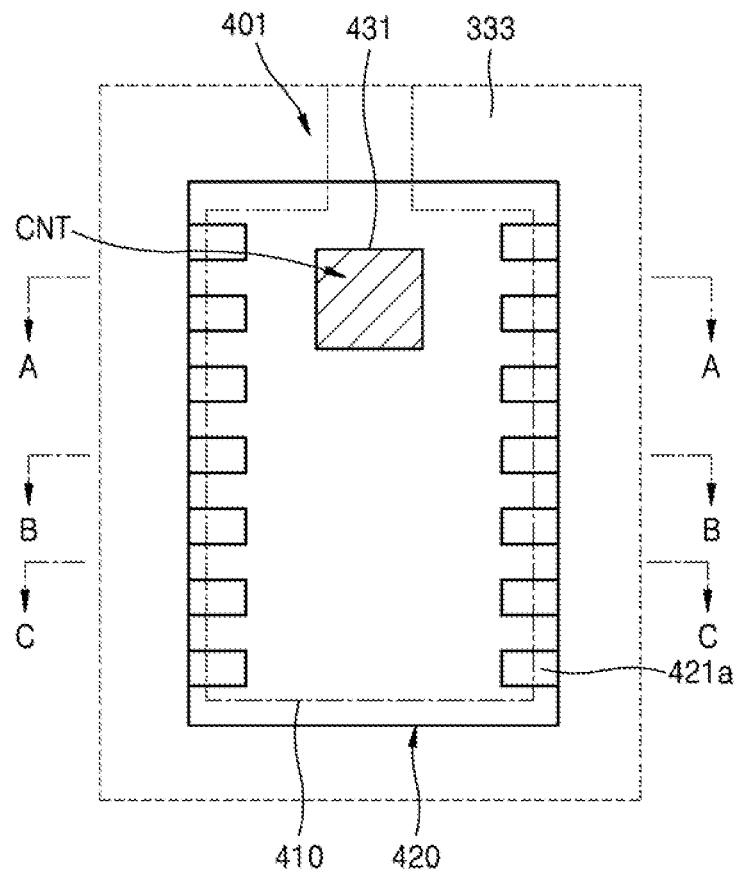
FIG. 4 is a plan view of one pad terminal of FIG. 3.

FIG. 1 is a plan view of a display apparatus according to an exemplary embodiment of the present invention, FIG. 2 is a cross-sectional view of the display apparatus illustrated in FIG. 1, and FIG. 4 is a plan view of one pad terminal of FIG. 3.

Referring to FIGS. 1 and 2, a display apparatus 100 includes a display panel 110. According to an exemplary embodiment of the present invention, the display apparatus 100 may be an organic light emitting display device (OLED). However, the display apparatus 100 is not limited thereto and may be a liquid crystal display (LCD), a field emission display (FED), an electronic paper display (EPD), or any other form of display.

The display panel 110 includes a display substrate 120 having a plurality of devices and a thin film encapsulation (TFE) layer 130 disposed on the display substrate 120. A plurality of thin film transistors (TFTs) and a plurality of light-emitting devices connected to the plurality of TFTs may be disposed on the display substrate 120. A functional film 140, such as a polarizing plate, a touch screen, or a cover window, may be disposed on the TFE layer 130.

An active area AA 111 and an inactive area IAA 112 may be disposed on the display panel 110. The active area AA 111 may display an image. The inactive area IAA 112 may surround the active area AA 111.

The TFE layer 130 may cover the active area AA 111.

A bending area BA 413, in which the display panel 110 is foldable in one direction, may be disposed within the inactive area IAA 112. A pad area PA may extend beyond the bending area BA and may also be disposed within the inactive area IAA 112. However, exemplary embodiments of the present invention are not limited thereto, and the bending area BA may alternatively be formed within the active area AA 111. However, hereinafter, for convenience of explanation, the case in which the bending area BA is formed within the inactive area IAA 112 will be described.

The display panel 110 may be folded in one direction along a bending line BL that is within the bending area BA. However, exemplary embodiments of the present invention are not limited thereto, and the active area AA 111 and the pad area PA may be connected to each other without the existence of the bending area BA. For example, the display panel 110 may also be rigid and no bending line BL might be present. However, hereinafter, for convenience of explanation, the display panel 110 will be described herein as being foldable along the bending line BL.

The pad area PA may be disposed at one edge of the display substrate 120. A plurality of pad terminals 150 may be disposed within the pad area PA. The plurality of pad terminals 150 may be spaced apart from each other in both the X-axis direction and the Y-axis direction of the display substrate 120. The pad terminals 150 may be connected to a wiring 113 that extends from the active area AA 111.

The plurality of pad terminals 150 may be electrically connected to a driver 160.

The driver 160 may include a driving circuit and the driver 160 may be a chip on plastic (COP). However, the driver 160 is not limited thereto. For example, the driver 160 may be a chip on film (COF) or a chip on glass (COG).

The driver 160 includes a flexible film 170 on which a circuit wiring is patterned, a driving integrated circuit (IC) 180 disposed on the display substrate 120, and a plurality of driving terminals 190 disposed under the driving IC 180. The flexible film 170 and the driving IC 180 may be electrically connected to each other, for example, via the display substrate 120.

The flexible film 170 may be electrically connected to a circuit board 200. The circuit board 200 may be a flexible printed circuit board (FPCB).

The pad terminals of the plurality of pad terminals 150 may be electrically connected to corresponding driving terminals of the plurality of driving terminals 190. For example, each of the plurality of pad terminals 150 may be directly connected to corresponding driving terminals.

Figure 8:
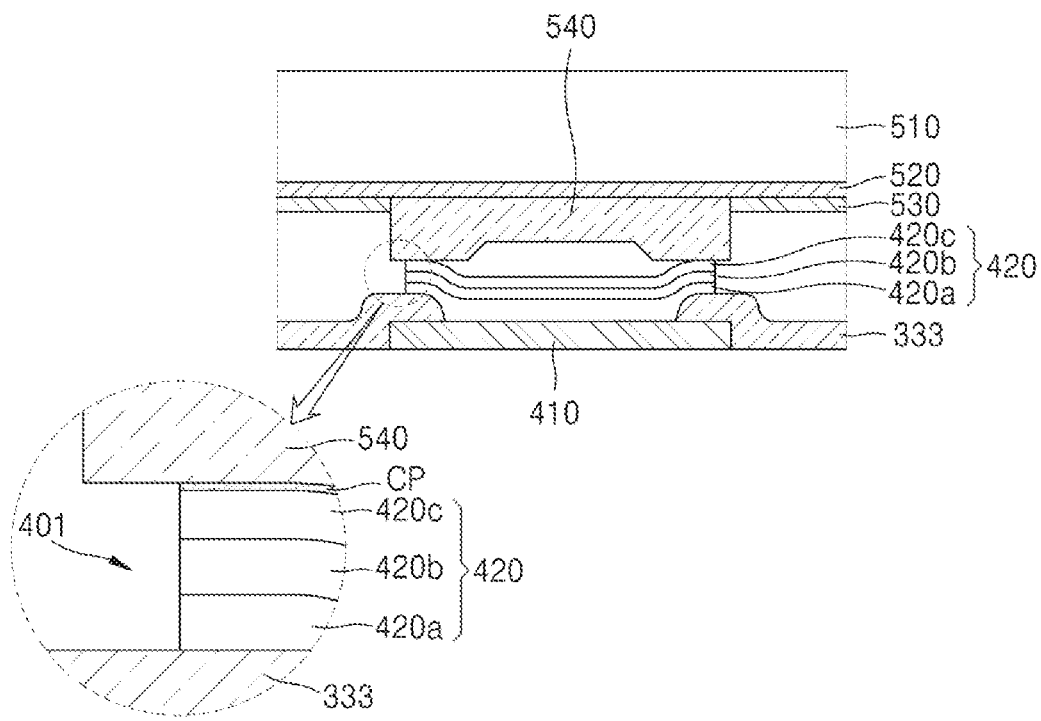
FIG. 8 is a cross-sectional view taken along line A-A of FIG. 4, which shows a driving terminal connected onto the pad terminal.

For example, the plurality of pad terminals 150 (see 420c of FIG. 8) and the plurality of driving terminals 190 (see 540 of FIG. 8) may be connected to one another via a connection portion (see CP of FIG. 8). The connection portion CP is a layer that is formed by ultrasonic bonding the pad terminals 150 and the driving terminals 190 to each other. Part of the adjacent pad terminals 150 and part of the driving terminals 190 are diffused toward each other during the ultrasound bonding process and are thereby coupled to each other. A detailed coupling structure of the pad terminals 150 and the driving terminal 190 will be described below with reference to FIGS. 8 through 21.

FIG. 3 is a cross-sectional view of a display panel according to an exemplary embodiment of the present invention, and FIG. 4 is a plan view illustrating a pad terminal of FIG. 3.

Referring to FIG. 3, a display panel 300 includes a display substrate 301 and a TFE layer 317. According to an exemplary embodiment of the present invention, the display panel 300 may be an organic light emitting display (OLED) panel.

A display area DA is disposed in the active area AA 111 of the display substrate 301 and a pad area PA is disposed in the inactive area IAA 112 of the display substrate 301.

The display substrate 301 may be a flexible glass substrate, a flexible polymer substrate, a rigid glass substrate, or a rigid polymer substrate. The display substrate 301 may be transparent, semitransparent, or opaque.

A barrier layer 302 may be disposed on the display substrate 301. The barrier layer 302 may cover a top surface of the display substrate 301. The barrier layer 302 may either be an organic layer or an inorganic layer. The barrier layer 302 may either include a single layer or may include multiple layers.

At least one TFT may be disposed in the display area DA.

A semiconductor active layer 303 may be disposed on the barrier layer 302. The semiconductor active layer 303 includes a source area 304 and a drain area 305, which may be formed by doping N-type impurity ions or P-type impurity ions into the semiconductor active layer 303. A channel region 306, into which no impurities are doped, may be formed between the source area 304 and the drain area 305. The semiconductor active layer 303 may include an organic semiconductor, an inorganic semiconductor, or amorphous silicon. According to an exemplary embodiment of the present invention, the semiconductor active layer 303 may include an oxide semiconductor.

A gate insulating layer 307 may be deposited onto the semiconductor active layer 303. The gate insulating layer 307 may either be an organic layer or inorganic layer. The gate insulating layer 307 may include either a single layer or multiple layers.

A gate electrode 308 may be disposed on the gate insulating layer 307. The gate electrode 308 may include an electrically conductive metal. For example, the gate electrode 308 may include molybdenum (Mo), aluminum (Al), copper (Cu), and/or titanium (Ti). The gate electrode 308 may include either a single layer or multiple layers.

An interlayer insulating layer 309 may be disposed on the gate electrode 308. The interlayer insulating layer 309 may either be an organic layer or an inorganic layer.

A source electrode 310 and a drain electrode 311 may be disposed on the interlayer insulating layer 309. Contact holes may be formed by removing part of the gate insulating layer 307 and part of the interlayer insulating layer 309. The source electrode 310 may be electrically connected to the source area 304 through one of the contact holes, and the drain electrode 311 may be electrically connected to the drain area 305 through another of the contact holes.

The source electrode 310 and the drain electrode 311 may be formed of a conductive metal. For example, the source electrode 310 and the drain electrode 311 may each include Mo, Al, Cu, and/or Ti. The source electrode 310 and the drain electrode 311 may each include either a single layer or multiple layers. For example, the source electrode 310 and the drain electrode 311 may each have a structure in which Ti/Al/Ti are stacked.

A protective layer 312 may be disposed on the source electrode 310 and the drain electrode 311. The protective layer 312 may either be an organic layer or inorganic layer. The protective layer 312 may be a passivation layer or a planarization layer. However, the passivation layer or the planarization layer may be omitted.

The TFT may be electrically connected to the OLED.

The OLED may be disposed on the protective layer 312. The OLED includes a first electrode 313, an intermediate layer 314, and a second electrode 315. The intermediate layer 314 may be disposed between the first and second electrodes 313 and 315.

The first electrode 313 serves as an anode and may be formed of various conductive materials. The first electrode 313 may be either a transparent electrode or a reflective electrode. For example, when the first electrode 313 is a transparent electrode, the first electrode 313 includes a transparent conductive layer. When the first electrode 313 is a reflective electrode, the first electrode 313 includes a reflective layer and a transparent conductive layer disposed on the reflective layer. According to an exemplary embodiment of the present invention, the first electrode 313 may have a structure in which ITO/Ag/ITO are stacked.

A pixel defining layer (PDL) 316 may be disposed on the protective layer 312. The PDL 316 may cover part of the first electrode 313. The PDL 316 may define an emission area of each of a plurality of sub-pixels by surrounding edges of the first electrode 313. The first electrode 313 may be patterned in each of the sub-pixels. The PDL 316 may either be an organic layer or an inorganic layer. The PDL 316 may include either a single layer or multiple layers.

The intermediate layer 314 may be disposed in an area of the PDL 316 that has been exposed by etching. The intermediate layer 314 may be formed by a deposition process.

The intermediate layer 314 may include an organic emission layer.

According to an exemplary embodiment of the present invention, the intermediate layer 314 includes a hole injection layer (HIL), a hole transport layer (HTL), an electron transport layer (ETL), and/or an electron injection layer (EIL), as well as an organic emission layer.

According to an exemplary embodiment of the present invention, the intermediate layer 314 may include an organic emission layer and may further include various other functional layers.

The second electrode 315 may be disposed on the intermediate layer 314.

The second electrode 315 may function as a cathode. The second electrode 315 may either be a transparent electrode or a reflective electrode. For example, when the second electrode 315 is a transparent electrode, the second electrode 315 includes a metal layer and a transparent conductive layer disposed on the metal layer. When the second electrode 315 is a reflective electrode, the second electrode 315 includes a metal layer.

According to an exemplary embodiment of the present invention, a plurality of sub-pixels may be formed on the display substrate 301. For example, red, green, and blue, or red, green, blue, and white sub-pixels may be included. However, embodiments of the present invention are not limited thereto.

The TFE layer 317 may cover the OLED.

First and second inorganic layers 318 and 319 and an organic layer 320 may be alternately stacked on the TFE layer 317. For example, the first inorganic layer 318, the organic layer 320, and the second inorganic layer 319 may be sequentially stacked on the OLED. There may be various modified examples of a stacked structure of the inorganic layers 318 and 319 and the organic layer 320 on the TFE layer 317.

A touch screen 340 may be installed on the TFE layer 317. According to an exemplary embodiment of the present invention, the touch screen 340 may be an electrostatic capacitive type touch screen. For example, a base layer may be disposed on the TFE layer 317. A plurality of touch electrode wirings may be disposed on the base layer. According to an exemplary embodiment of the present invention, the plurality of touch electrode wirings may have a structure in which Ti/Al/Ti are stacked. According to an exemplary embodiment of the present invention, the base layer may be omitted. The touch electrode wirings may cover a touch electrode insulating layer. The touch electrode insulating layer may be an organic layer or an inorganic layer.

A first insulating layer 331 may be disposed in the pad area PA of the display substrate 301. The first insulating layer 331 may be disposed on the same layer as the barrier layer 302. For example, the first insulating layer 331 may be formed of the same material and by the same process as the barrier layer 302.

A second insulating layer 332 may be disposed on the first insulating layer 331. The second insulating layer 331 may be disposed on the same layer as the gate insulating layer 307. For example, the second insulating layer 332 may be formed of the same material and by the same process as the gate insulating layer 307.

First conductive layers 410 disposed on each pad terminal 401 may be disposed on the second insulating layer 332 as each other. The first conductive layers 410 may be electrically connected to a wiring 325 that extends from the display area DA. The first conductive layers 410 may be disposed on the same layer as the gate electrode 308. For example, each of the first conductive layers 410 may be formed of the same material and in the same process the gate electrode 308. The first conductive layers 410 may be spaced apart from one another in one direction of the display substrate 301.

A third insulating layer 333 may be disposed on each of the first conductive layers 410. The third insulating layer 333 may be disposed on the same layer as the interlayer insulating layer 309. The third insulating layer 333 may be formed of the same material and in the same process as the interlayer insulating layer 309. According to an exemplary embodiment of the present invention, the third insulating layer 333 may either be an organic layer or an inorganic layer.

The third insulating layer 333 may cover at least part of the first conductive layer 410. By removing part of the third insulating layer 333, a contact hole 431 may be formed in the first conductive layer 410. A top surface of the first conductive layer 410 may be exposed in a region of the first conductive layer 410 in which the contact hole 431 is formed.

Second conductive layers 420 may be disposed on the first conductive layers 410. The second conductive layers 420 may be disposed in an island form on the first conductive layers 410. According to an exemplary embodiment of the present invention, the second conductive layers 420 may be electrically connected to the wiring 325 that extends from the display area DA.

The second conductive layers 420 may be disposed on the same layer as both the source electrode 310 and the drain electrode 311. For example, the second conductive layer 420 may be formed of the same material and in the same process as the source electrode 310 and the drain electrode 311. According to an exemplary embodiment of the present invention, the second conductive layers 420 may include a plurality of layers in which layers of Al and/or Ti are stacked. The stack structure of the second conductive layer 420 may be differently composed, for example, the second conductive layer 420 may include stacked layers such as Al/Ti/Al or Ti/Al/Ti.

Referring to FIGS. 3 and 4, the second conductive layer 420 may be electrically connected to the first conductive layer 410 via the contact hole 431. For example, the second conductive layer 420 may be electrically connected to the first conductive layer 410 in a region in the third insulating layer 333 is not disposed. The first conductive layer 410 and the second conductive layer 420 may form a contact portion CNT in a region in which the contact hole 431 is formed.

The second conductive layer 420 may extend over a region of the first conductive layer 410 exposed through the contact hole 431 of FIG. 4 and the second conductive layer 420 may extend partially over the third insulating layer 333 where the third insulating layer 333 covers the first conductive layer 410 (e.g., as shown in FIG. 8).

As illustrated in FIG. 4, the size of the second conductive layer 420 may be greater than the size of the first conductive layer 410. For example, the second conductive layer 420 may have the size sufficiently long so as to entirely cover the first conductive layer 410. The first conductive layer 410 and the second conductive layer 420 might not be electrically connected to each other in all regions but rather, they may be connected to each other through the contact hole 431 where part of the third insulating layer 333 is removed. Part of the second conductive layer 420 may be disposed in the exposed region of the first conductive layer 410 through the contact hole 431, and another part of the second conductive layer 420 may be disposed on the third insulating layer 333.

As will be described in greater detail below, each of the driving terminals 540 may be electrically connected to a corresponding pad terminal 401 (see FIG. 8). A circuit pattern 520 may be disposed under a driving IC 510. An insulating layer 530 may cover part of the circuit pattern 520. Each of the driving terminals 540 may be electrically connected to the circuit pattern 520. Each of the driving terminals 540 includes a bump. The driving terminal 540 may include gold (Au), nickel (Ni), and/or tin (Sn).

Figure 10:
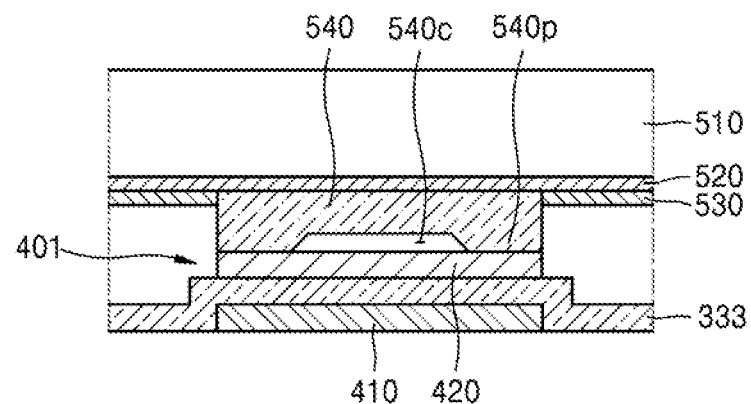
FIG. 10 is a cross-sectional view taken along line C-C of FIG. 4, which shows the driving terminal connected to the pad terminal.

Each of the driving terminals 540 may extend to a region in which the first conductive layer 410 and the second conductive layer 420 of FIG. 8 are electrically connected to each other and each of the driving terminals 540 may extend to a region in which the first conductive layer 410 and the second conductive layer 420 of FIG. 10 are spaced apart from each other and the third insulating layer 333 is disposed therebetween.

According to an exemplary embodiment of the present invention, the first conductive layer 410 and the second conductive layer 420 may be disposed on the same layers as other metal layers disposed on the display substrate 301 of FIG. 3. These other metal layers may include the first electrode 313, the second electrode 315, and/or the touch electrode 322, as well as the gate electrode 308, the source electrode 310, and/or the drain electrode 311.

According to an exemplary embodiment of the present invention, the third insulating layer 333 may be disposed on the same layer as an insulating layer, such as the gate insulating layer 307, the protective layer 312, the PDL 316, the TFE layer 317, and/or the touch electrode insulating layers 323 and 324, which are patterned on the display substrate 301 of FIG. 3, as well as the interlayer insulating layer 309.

Hereinafter, the pad terminal 400 and the driving terminal 540 will be described in detail with reference to FIGS. 4 through 23.

Figure 5:
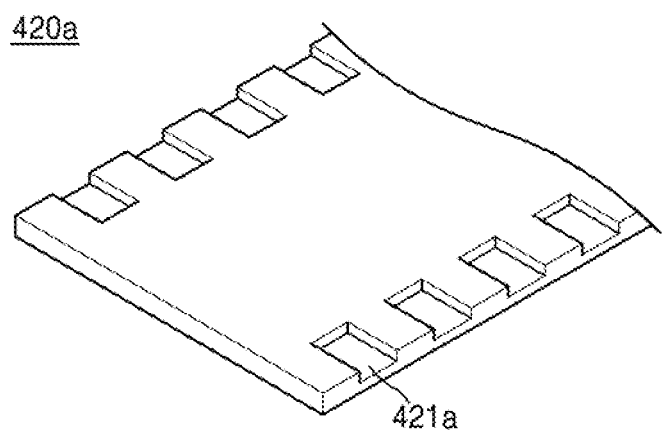
FIG. 5 is a perspective view of part of the pad terminal of FIG. 4.
Figure 6:
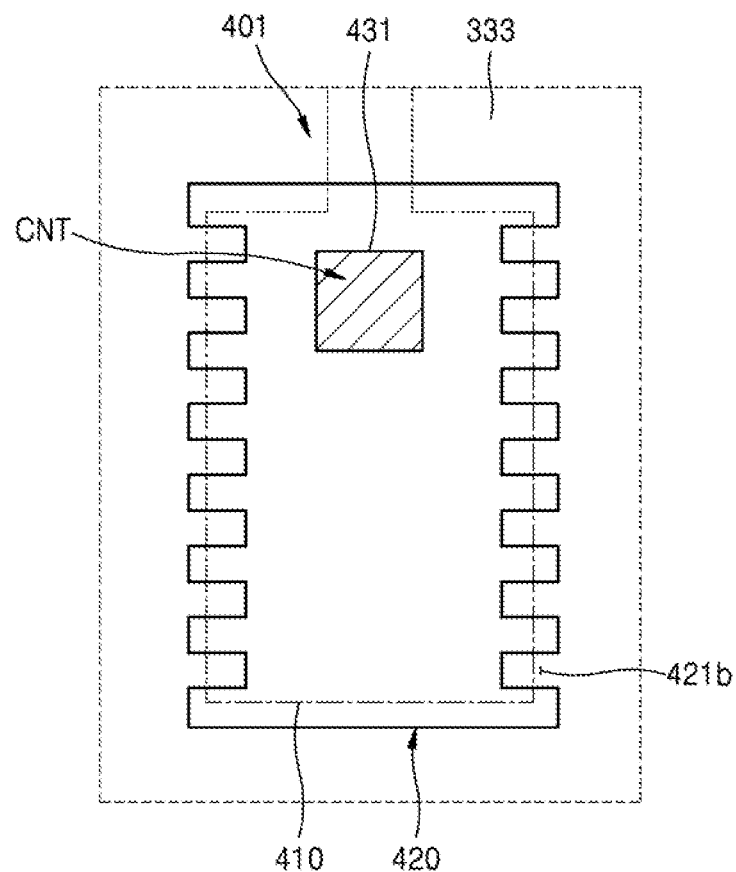
FIG. 6 is a plan view of a modified example of the pad terminal of FIG. 4.
Figure 7:
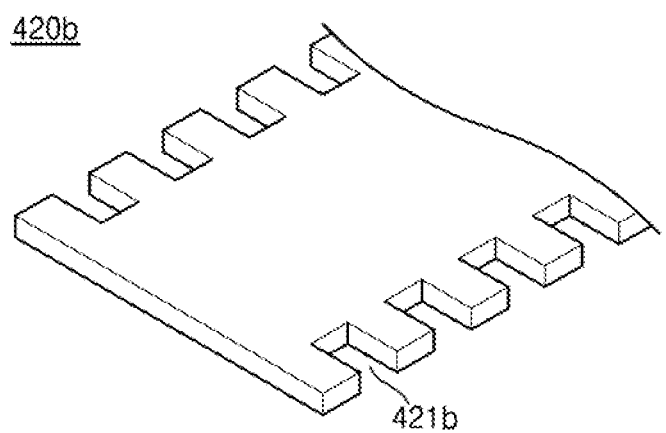
FIG. 7 is a perspective view of part of the pad terminal of FIG. 6.
Figure 9:
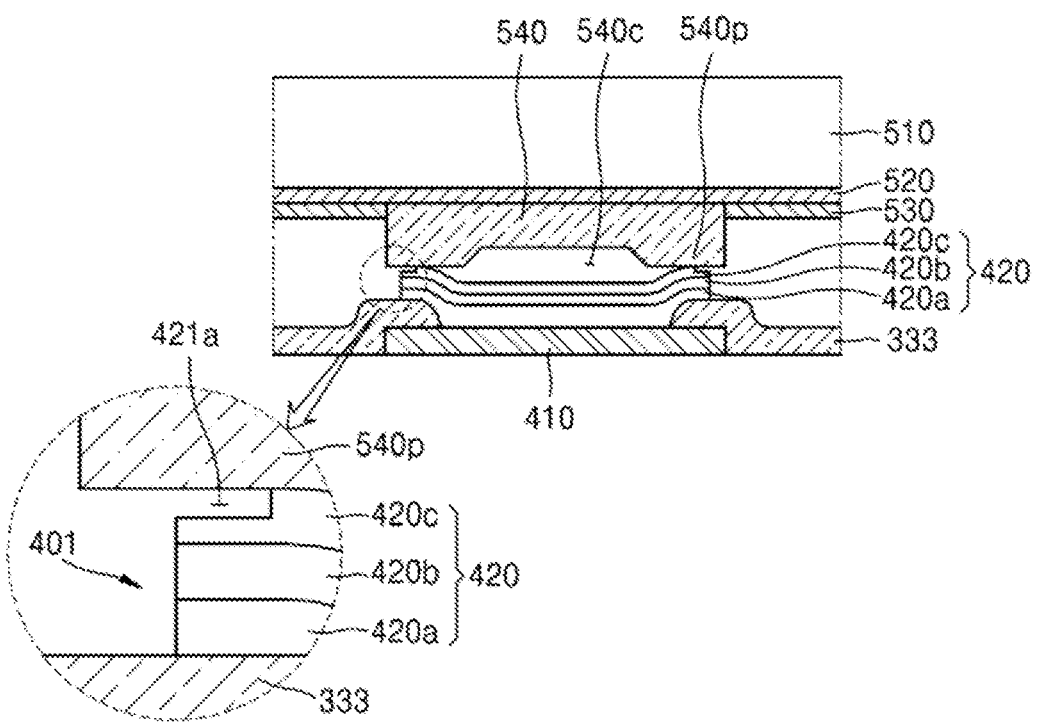
FIG. 9 is a cross-sectional view taken along line B-B of FIG. 4, which shows the driving terminal connected to the pad terminal.
Figure 11:
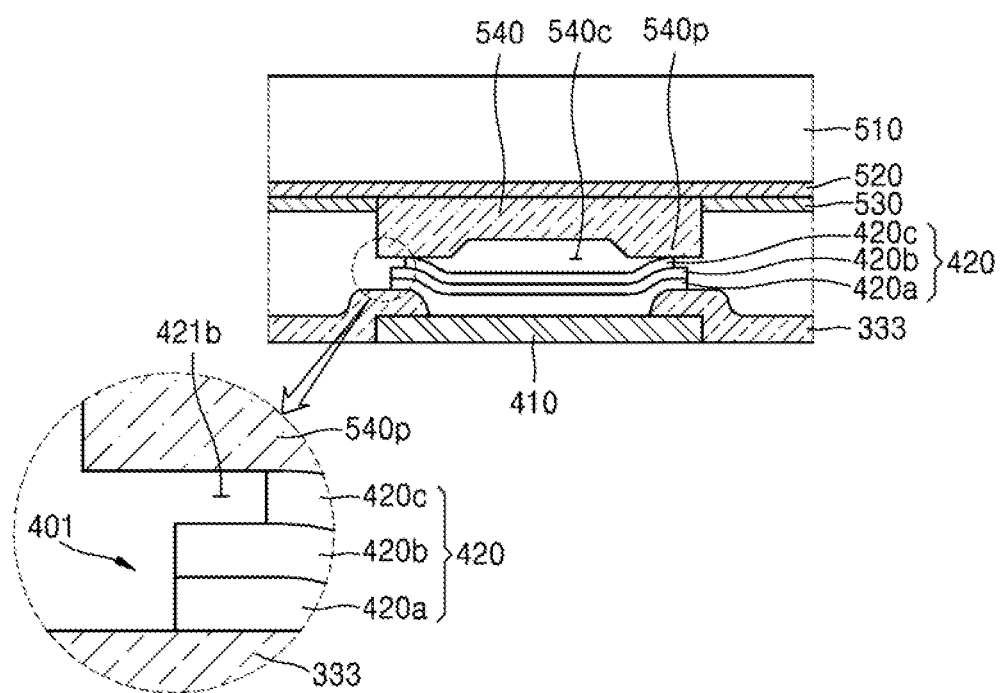
FIG. 11 is a cross-sectional view of a modified example of FIG. 9.
Figure 12:
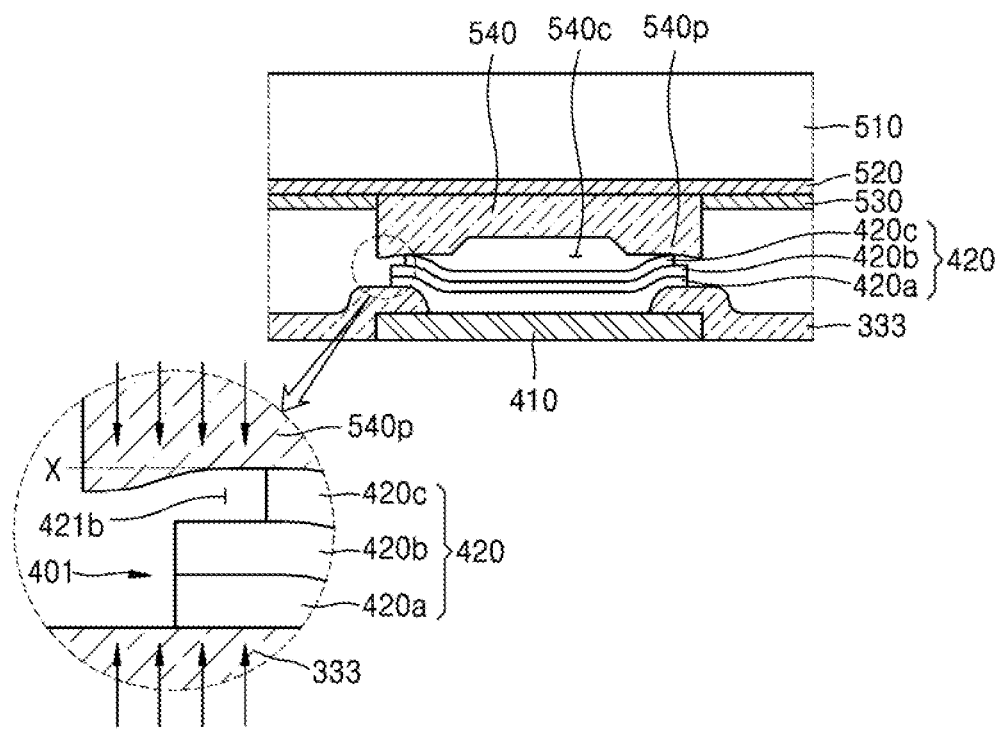
FIG. 12 is a cross-sectional view of the pressurized driving terminal and pad terminal of FIG. 11.

FIG. 5 is a perspective view of part of the pad terminal of FIG. 4. FIG. 6 is a plan view of one modified example of the pad terminal of FIG. 4. FIG. 7 is a perspective view of part of the pad terminal of FIG. 6. FIG. 8 is a cross-sectional view taken along line A-A of FIG. 4, which shows a driving terminal connected onto the pad terminal. FIG. 9 is a cross-sectional view taken along line B-B of FIG. 4, which shows the driving terminal connected to the pad terminal. FIG. 10 is a cross-sectional view taken along line C-C of FIG. 4, which shows the driving terminal connected to the pad terminal. FIG. 11 is a cross-sectional view of one modified example of FIG. 9. FIG. 12 is a cross-sectional view of the pressurized driving terminal and pad terminal of FIG. 11.

Referring to FIGS. 3 and 4, a plurality of pad terminals 400 may be disposed in the pad area PA and may be electrically connected to the driving terminal 540. Each pad terminal 401 of the plurality of pad terminals 400 may be spaced apart from one another in one direction of the display substrate 301.

For example, referring to FIGS. 4 through 7, each pad terminal 401 may include either a stepped groove 421a partially penetrating a surface facing each of the driving terminals 540 or an opening hole 42 1b that fully penetrates each pad terminal 401. For convenience of explanation, in FIGS. 4 and 5, only the stepped groove 421a is shown as being formed in each pad terminal 401, and in FIGS. 6 and 7, only the opening hole 421b is shown as being formed in each pad terminal 401. However, embodiments of the present invention are not limited thereto. For example, each pad terminal 401 may include both the stepped groove 421a and the opening hole 421b.

Referring to FIG. 8, each pad terminal 401 and the driving terminal 540 may be electrically connected to each other via the connection portion CP. As described above, each pad terminal 401 and the driving terminal 540 may be coupled to each other by performing ultrasound bonding. Through ultrasound bonding, surfaces on which each pad terminal 401 and the driving terminal 540 contact each other may be softened and diffused and thus the surfaces may be coupled to each other.

Thus, the connection portion CP may be formed as a mixed layer in which part of each pad terminal 401 and part of the driving terminal 540 are mixed with each other. For example, when each pad terminal 401 is formed of Ti and the driving terminal 540 is formed of Au, ultrasound bonding may create a connection portion CP that includes both Ti and Au.

Meanwhile, a plurality of stepped grooves 421a and a plurality of opening holes 421b may be formed on the entire surface of each pad terminal 401. At least part of the plurality of stepped grooves 421a and the plurality of opening holes 421b may be shielded by the connection portion CP.

For example, as described above, each pad terminal 401 and the driving terminal 540 are connected to each other using ultrasound bonding. In this case, ultrasound bonding may be performed on part of the driving terminal 540 when the part of the driving terminal 540 is inserted into the stepped groove 421a or the opening hole 421b of each pad terminal 401. Thus, the connection portion CP formed by connecting each pad terminal 401 and the driving terminal 540 using ultrasound bonding may shield part of the stepped groove 421a or the opening hole 421b.

The stepped groove 421a or the opening hole 421b may be formed in a region in which each pad terminal 401 and the driving terminal 540 do not contact each other. In this case, the stepped groove 421a and the opening hole 421b might not be shielded by the connection portion CP but, rather, may remain exposed.

An operation of connecting each pad terminal 401 and the driving terminal 540 using ultrasound bonding will be described below in detail with reference to FIG. 12.

Referring back to FIGS. 8 through 12, each pad terminal 401 of the plurality of pad terminals 400 may include a first conductive layer 410 and a plurality of second conductive layers 420 (including 420a, 420b, and 420c). The plurality of second conductive layers 420 is disposed on the first conductive layer 410. Although three, second conductive layers 420a, 420b, and 420c are shown in the drawings, the second conductive layers 420 may alternatively be formed as a single layer. Thus, hereinafter, for convenience of explanation, it is assumed that the second conductive layers 420a, 420b and 420c are formed as a single second conductive layer 420, and a structure in which the second conductive layer 420 is coupled to the driving terminal 540, will be described.

At least part of the first conductive layer 410 and at least part of the second conductive layer 420 may be electrically connected to each other. Here, the stepped groove 421a and the opening hole 421b of each pad terminal 401 may be formed in the second conductive layer 420. For example, the stepped groove 421a and the opening hole 421b may be formed within one of the plurality of second conductive layers 420a, 420b, and 420c at an upper side facing the driving terminal 540.

The driving terminal 540 illustrated in FIGS. 8 through 12 may include a protrusion portion 540p that protrudes toward each pad terminal 401 at an edge of one surface of the driving terminal 540 facing each pad terminal 401. The protrusion portion 540p may contact the respective pad terminal 401 and a concave portion 540c that is inserted in a direction opposite to a direction toward each pad terminal 401 in the center of the driving terminal 540 and spaced apart from the respective pad terminal 401.

However, embodiments of the present invention are not limited thereto. For example, the protrusion portion 540p of the driving terminal 540 may be formed in the center of the driving terminal 540, and alternatively, the concave portion 540c may be formed at an edge of one surface of the driving terminal 540 facing each pad terminal 401. This configuration will be described in greater detail below with reference to FIGS. 13 through 15.

According to the above-described configuration, as illustrated in FIG. 9, when the protrusion portion 540p of the driving terminal 540 is formed at an edge of one surface of the driving terminal 540 facing each pad terminal 401, the connection portion (CP of FIG. 8) may be formed at the edge of the driving terminal 540 of each pad terminal 401. At least part of the stepped groove (421a of FIG. 9) and at least part of the opening hole (421b of FIG. 11) may also be formed at edges of each pad terminal 401 and the driving terminal 540.

Here, the connection portion CP is shown in FIG. 8. FIGS. 9 and 11 show a state before each pad terminal 401 and the driving terminal 540 are ultrasonic-bonded, and therefore, before the connection portion CP is formed. A process in which the connection portion CP is formed will be described in detail below with reference to FIG. 12.

FIG. 12 illustrates part of a process of manufacturing the display apparatus 100 in which each pad terminal 401 and the driving terminal 540 are coupled to each other. For example, FIG. 12 shows a state after a process of forming an opening hole 421*b* in the second conductive layer 420 of each pad terminal 401 has been performed, and a state in which each pad terminal 401 and the driving terminal 540 contact each other and are pressurized in a first direction (a direction of arrows) in which each pad terminal 401 and the driving terminal 540 are close to each other. Pressure may be applied to bring each pad terminal 401 into close contact with the driving terminal 540.

Figure 18:
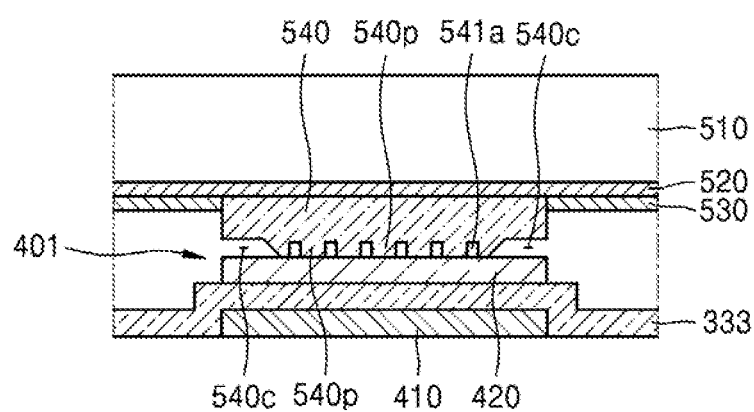
FIG. 18 is a cross-sectional view of a modified example of FIG. 10.
Figure 19:
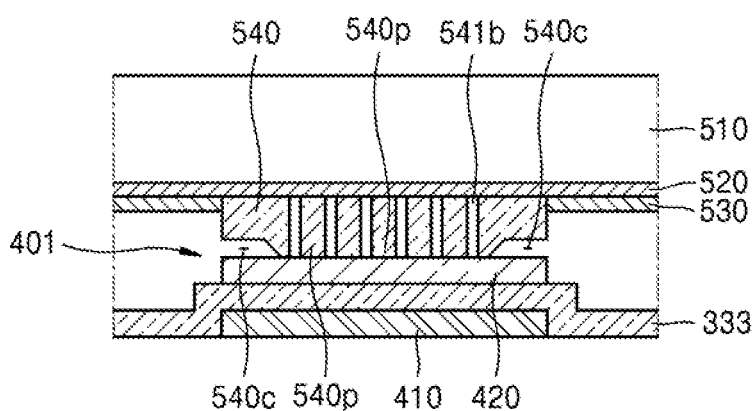
FIG. 19 is a cross-sectional view of a modified example of FIG. 10.
Figure 20:
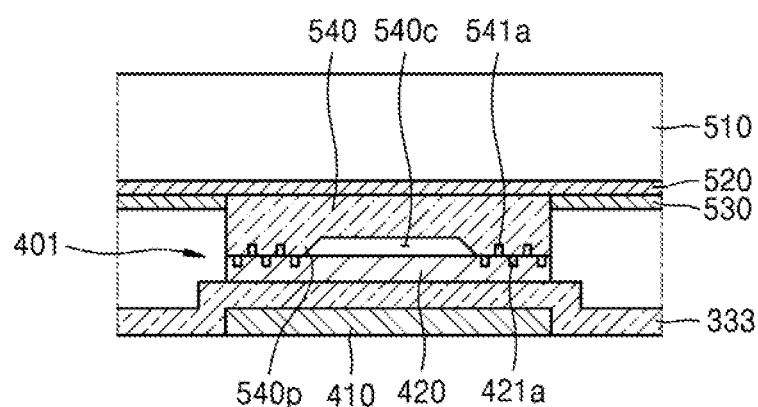
FIG. 20 is a cross-sectional view of a modified example of FIG. 10.
Figure 21:
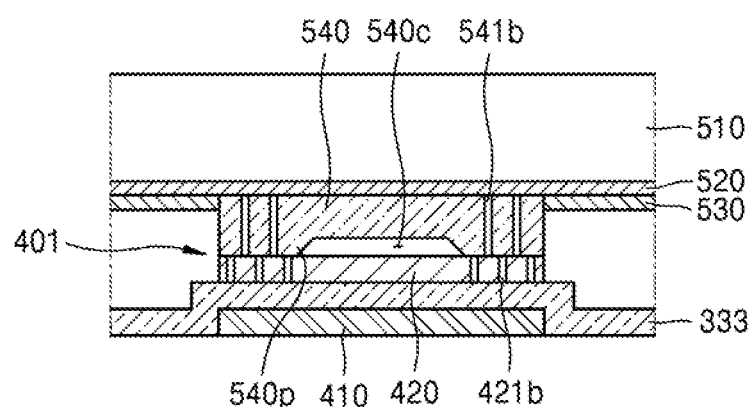
FIG. 21 is a cross-sectional view of a modified example of FIG. 10.

However, embodiments of the present invention are not limited to the above-described configuration. The opening hole 421*b* may be formed in the driving terminal 540, as shown in FIGS. 16 through 19, as well as in each pad terminal 401. Also, as illustrated in FIGS. 20 and 21, the opening hole 421*b* may be formed in each pad terminal 401 and in the driving terminal 540. Also, the stepped groove 421*a* of FIG. 9, as well as the opening hole 421*b*, may also be formed in each pad terminal 401 and/or the driving terminal 540.

Hereinafter, as illustrated in FIG. 12, a process in which each pad terminal 401 and the driving terminal 540 are coupled to each other will be described based on a case where the opening hole 421*b* is formed in only the second conductive layer 420 of each pad terminal 401.

In order to couple each pad terminal 401 and the driving terminal 540 to each other, as shown in FIG. 12, when each pad terminal 401 and the driving terminal 540 are pressurized in the first direction (see arrows) in which each pad terminal 401 and the driving terminal 540 are close to each other, part of the driving terminal 540 may be inserted into the opening hole 421*b* of the second conductive layer 420. For example, when the driving terminal 540 is pressurized toward each pad terminal 401, the driving terminal 540 may be moved lower than a shape of the driving terminal 540 before being pressurized (see the X-axis of FIG. 12). This is because part of the driving terminal 540 may be inserted into a space of the opening hole 421*b*.

In this state, each pad terminal 401 and the driving terminal 540 may be vibrated in a second direction that crosses the first direction (for example, the first direction may be a width direction and the second direction may be a height directions of FIG. 4). Also, each pad terminal 401 and the driving terminal 540 may be electrically coupled to each other using an ultrasound bonding process.

In this case, part of the driving terminal 540 inserted into the opening hole 421*b* and the second conductive layer 420 of each pad terminal 401 may be mixed with each other and the connection portion CP may be formed thereby. The connection portion CP may be formed to fully fill the opening hole 421*b*. Alternatively, the connection portion CP may be formed to only partially fill the opening hole 421*b* so that the connection portion CP may have a structure for shielding the opening hole 421*b* from the outside.

In general, when each pad terminal 401 and the driving terminal 540 are connected to each other using ultrasound bonding, a slip phenomenon may occur at an interface between each pad terminal 401 and the driving terminal 540. When the slip phenomenon occurs at the interface between each pad terminal 401 and the driving terminal 540, each pad terminal 401 might not be properly aligned with the driving terminal 540 and a connection defect in which each pad terminal 401 and the driving terminal 540 are not electrically connected to each other, may occur.

Where each pad terminal 401 and the driving terminal 540 have the above structure, each pad terminal 401 and the driving terminal 540 may be vibrated when part of the driving terminal 540 is inserted into the stepped groove 421*a* or the opening hole 421*b* formed in each pad terminal 401 such that friction between each pad terminal 401 and the driving terminal 540 may be maximized.

Thus, when the stepped groove 421*a* or the opening hole 421*b* is formed in each pad terminal 401 at the connection portion CP where each pad terminal 401 and the driving terminal 540 are connected to each other, a frictional force between each pad terminal 401 and the driving terminal 540 is maximized so that a slip phenomenon occurring between each pad terminal 401 and the driving terminal 540 may be minimized.

Figure 13:
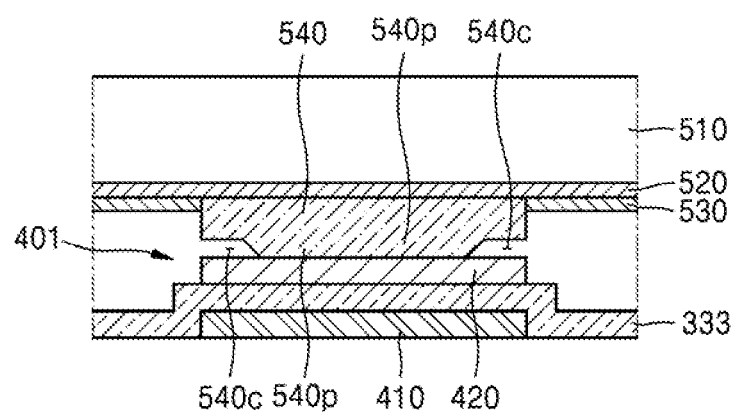
FIG. 13 is a cross-sectional view of a modified example of FIG. 10.
Figure 14:
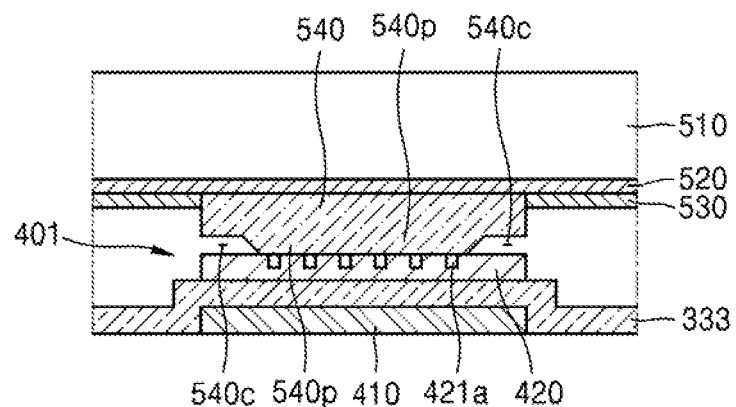
FIG. 14 is a cross-sectional view of a modified example of FIG. 10.
Figure 15:
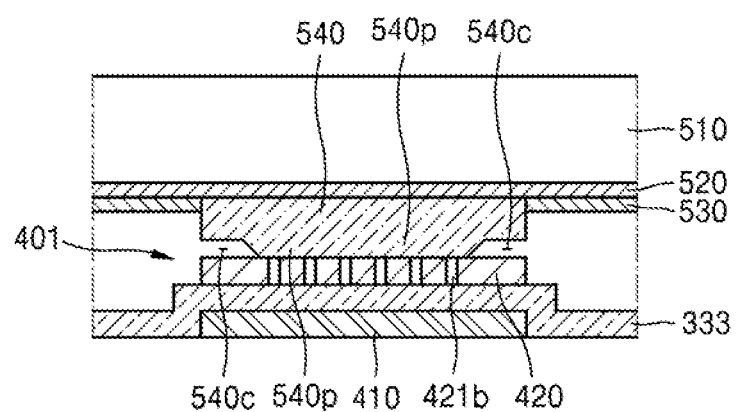
FIG. 15 is a cross-sectional view of a modified example of FIG. 10.

FIG. 13 is a cross-sectional view of a modified example of FIG. 10. FIG. 14 is a cross-sectional view of a modified example of FIG. 10. FIG. 15 is a cross-sectional view of a modified example of FIG. 10.

Referring to FIG. 13, the protrusion portion 540*p* of the driving terminal 540 may also be formed in the center of the driving terminal 540, as described above. In this case, a connection portion may be formed in the center of each pad terminal 401 and the driving terminal 540, and at least part of the stepped groove 421*a* and the opening hole 421*b* may also be formed in the center of each pad terminal 401 and the driving terminal 540.

Referring to FIG. 14, the stepped groove 421*a* may be formed in the center of the second conductive layer 420 of each pad terminal 401 that contacts the protrusion portion 540*p*. Thus, when an ultrasound bonding process of each pad terminal 401 and the driving terminal 540 is performed, part of the driving terminal 540 is inserted into the stepped groove 421*a*. In this state, ultrasound bonding is performed so that each pad terminal 401 and the driving terminal 540 may be electrically connected to each other through the connection portion.

Referring to FIG. 15, the opening hole 421*b* may also be formed in the center of the second conductive layer 420 of each pad terminal 401 that contacts the protrusion portion 540*p*. Thus, when an ultrasound bonding process of each pad terminal 401 and the driving terminal 540 is performed, part of the driving terminal 540 is inserted into the opening hole 421*b*. In this case, ultrasound bonding is performed so that each pad terminal 401 and the driving terminal 540 may be electrically connected to each other through the connection portion.

Meanwhile, the stepped groove 421*a* and the opening hole 421*b* may also be formed in the driving terminal 540, as well as in each pad terminal 401. This structure will be described below with reference to FIGS. 16 through 19.

Figure 16:
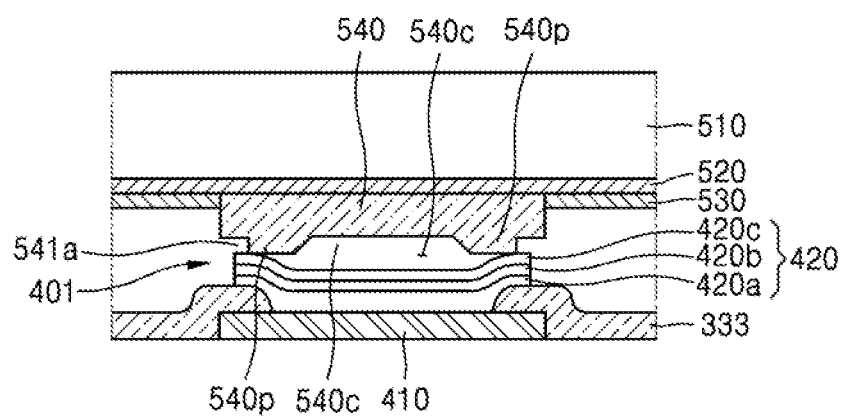
FIG. 16 is a cross-sectional view of a modified example of FIG. 9.
Figure 17:
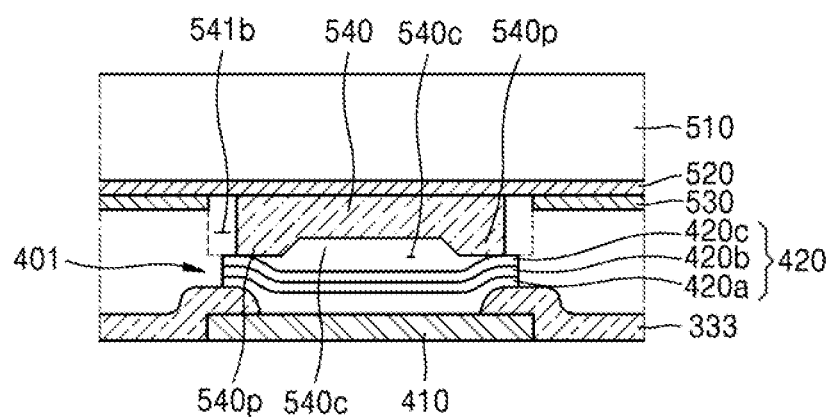
FIG. 17 is a cross-sectional view of a modified example of FIG. 9.

FIG. 16 is a cross-sectional view of a modified example of FIG. 9. FIG. 17 is a cross-sectional view of a modified example of FIG. 9. FIG. 18 is a cross-sectional view of a modified example of FIG. 10. FIG. 19 is a cross-sectional view of a modified example of FIG. 10.

Referring to FIG. 16, the protrusion portion 540*p* of the driving terminal 540 may be formed at an edge of one surface of the driving terminal 540 that faces each pad terminal 401. A stepped groove 541*a* may be formed in the protrusion portion 540*p*. The stepped groove 541*a* shown in FIG. 16 is not enlarged, as shown in FIG. 9. However, like in the stepped groove 421a of FIG. 9, the stepped groove 541a may be formed in part of the protrusion portion 540p, and the other part of the protrusion portion 540p may contact the second conductive layer 420 of each pad terminal 401.

Through this structure, when the ultrasound bonding process of each pad terminal 401 and the driving terminal 540 is performed, part of the second conductive layer 420 may be inserted into the stepped groove 541a. In this state, the ultrasound bonding process is performed so that a connection portion (may be formed and may electrically connect each pad terminal 401 to the driving terminal 540.

Meanwhile, referring to FIG. 17, an opening hole 541b may also be formed in the protrusion portion 540p at the edge of one surface of the driving terminal 540 that faces each pad terminal 401. Thus, when the ultrasound bonding process of each pad terminal 401 and the driving terminal 540 is performed, part of the second conductive layer 420 may be inserted into the opening hole 541b. In this case, the ultrasound bonding process is performed so that a connection portion may be formed to electrically connect each pad terminal 401 to the driving terminal 540.

Referring to FIG. 18, the protrusion portion 540p of the driving terminal 540 may also be formed in the center of the driving terminal 540. The stepped groove 541a may be formed in the protrusion portion 540p in the center of the driving terminal 540. Through this structure, when the ultrasound bonding process of each pad terminal 401 and the driving terminal 540 is performed, part of the second conductive layer 420 may be inserted into the stepped groove 541a. In this state, when the ultrasound bonding process of each pad terminal 401 and the driving terminal 540 is performed, part of the second conductive layer 420 may be inserted into the stepped groove 541a. In this state, the ultrasound bonding process is performed so that a connection portion may be formed to electrically connect each pad terminal 401 to the driving terminal 540.

Referring to FIG. 19, the opening hole 541b may also be formed in the protrusion portion 540p formed in the center of the driving terminal 540. Through this structure, when the ultrasound bonding process of each pad terminal 401 and the driving terminal 540 is performed, part of the second conductive layer 420 may be inserted into the opening hole 541b. In this state, the ultrasound bonding process is performed so that a connection portion may be formed to electrically connect each pad terminal 401 to the driving terminal 540.

The stepped groove 421a and the opening hole 421b may be simultaneously formed in each pad terminal 401 and the driving terminal 540. This structure will be descried below with reference to FIGS. 20 and 21.

FIG. 20 is a cross-sectional view of a modified example of FIG. 10, and FIG. 21 is a cross-sectional view of a modified example of FIG. 10.

Referring to FIG. 20, a second stepped groove 541a may be formed in the protrusion portion 540p at the edge of one surface of the driving terminal 540 that faces each pad terminal 401, and simultaneously, a first stepped groove 421a may be formed in the second conductive layer 420 of each pad terminal 401 that contacts the protrusion portion 540p. Here, a first stepped groove 421a and the second stepped groove 541a may be disposed to project in opposite directions with respect to each other.

Through this structure, when the ultrasound bonding process of each pad terminal 401 and the driving terminal 540 is performed, due to pressure applied to each pad terminal 401 and the driving terminal 540, part of each pad terminal 401 may be inserted into the second stepped groove 541a formed in the driving terminal 540, and simultaneously, part of the driving terminal 540 may be inserted into the first stepped groove 421a formed in each pad terminal 401. In this state, the ultrasound bonding process may be performed to form a connection portion electrically connecting each pad terminal 401 and the driving terminal 540.

Meanwhile, referring to FIG. 21, a second opening hole 541b may be formed in the protrusion portion 540p at the edge of one surface of the driving terminal 540 that faces each pad terminal 401, and simultaneously, a first opening hole 421b may be formed in the second conductive layer 420 of each pad terminal 401 that contacts the protrusion portion 540p. Here, the first opening hole 421b and the second opening hole 541b may be disposed to project in opposite directions.

Through this structure, when the ultrasound bonding process of each pad terminal 401 and the driving terminal 540 is performed, due to pressure applied to each pad terminal 401 and the driving terminal 540, part of each pad terminal 401 may be inserted into the second opening hole 541b formed in the driving terminal 540, and simultaneously, part of the driving terminal 540 may be inserted into the first opening hole 421b formed in each pad terminal 401. In this state, the ultrasound bonding process may be performed so that a connection portion may be formed to electrically connect each pad terminal 401 to the driving terminal 540.

When one or both of the stepped groove 421a and the first opening hole 421b and one or both of the second stepped groove 541a and the second opening hole 541b are respectively formed in each pad terminal 401 and the driving terminal 540, as illustrated in FIGS. 20 and 21, the center of the driving terminal 540 may also be formed as a concave portion 540c, and the edge of one surface of the driving terminal 540 that faces each pad terminal 401 may also be formed as the protrusion portion 540p. However, embodiments of the present invention are not limited thereto.

For example, as illustrated in FIGS. 13 through 15 or FIGS. 18 and 19, in a state in which the center of the driving terminal 540 is formed as the protrusion portion 540p and the edge of one surface of the driving terminal 540 that faces each pad terminal 401 is formed as the concave portion 540c, one or both of the stepped groove 421a and the opening hole 421b may be formed in the center of each pad terminal 401. Also, one or both of the stepped groove 541a and the opening hole 541b may also be formed in a protrusion portion (not shown) of the driving terminal 540.

Various shapes of second conductive layers 1420 and 2420 of each pad terminal 1400 will be described with reference to FIGS. 22 and 23.

Figure 22:
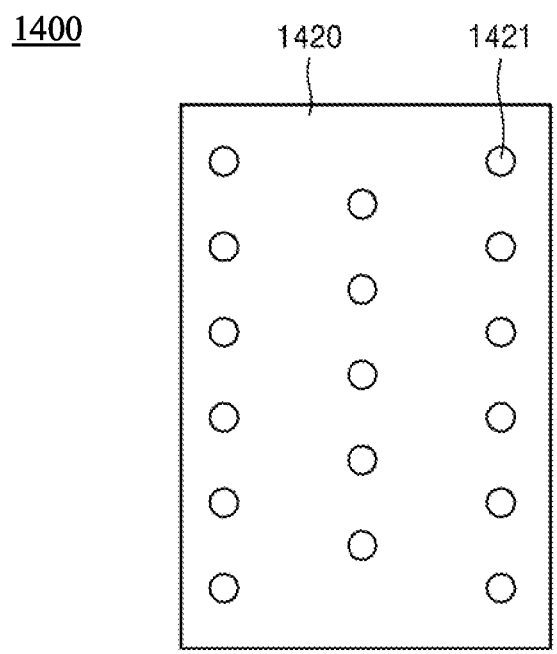
FIG. 22 is a plan view of a modified example of the pad terminal of FIG. 4.
Figure 23:
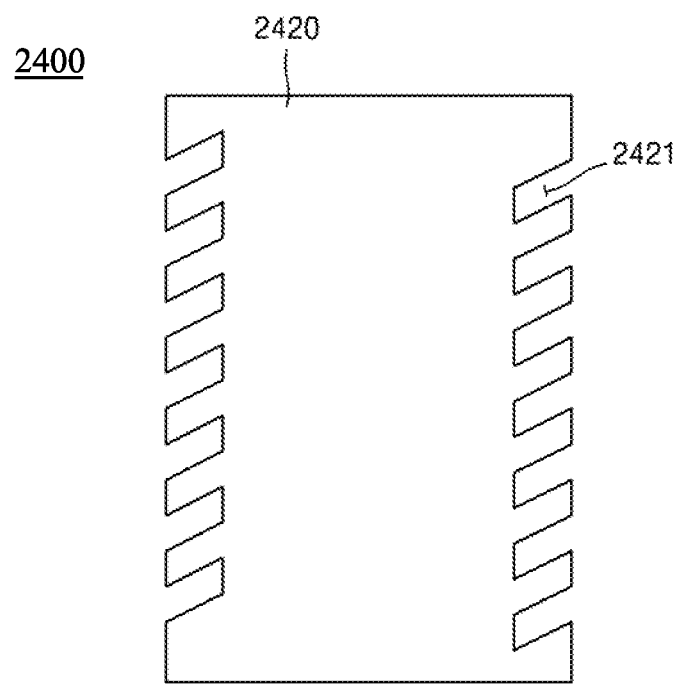
FIG. 23 is a plan view of a modified example of the pad terminal of FIG. 4.

FIG. 22 is a plan view of a modified example of each pad terminal 401 of FIG. 4, and FIG. 23 is a plan view of a modified example of each pad terminal 401 of FIG. 4.

Referring to FIG. 22, according to an exemplary embodiment of the present invention, the second conductive layer 1420 of each pad terminal 1400 may include a plurality of circular opening holes 1421. FIG. 22 shows the opening holes 1421 that pass through the second conductive layer 1420. However, embodiments of the present invention are not limited thereto. The opening holes 1421 may also be formed as stepped grooves 1421 spaced apart from a surface facing the driving terminal 540 by a predetermined distance.

Through this structure, part of the driving terminal 540 that contacts the second conductive layer 1420 may be inserted into each of the opening holes 1421. Through this structure, in a process of coupling the pad terminal 1400 and the driving terminal 540 using ultrasound bonding, due to part of the driving terminal 540 inserted into the opening hole 1421, the pad terminal 1400 and the driving terminal are engaged with each other so that friction between the pad terminal 1400 and the driving terminal 540 may be maximized and slipping may be minimized.

Next, referring to FIG. 23, the second conductive layer 2420 of a pad terminal 2400 may also include a plurality of opening holes 2421 formed in both sides of the second conductive layer 2420 at a particular angle of inclination. FIG. 23 shows the opening holes 2421 that pass through the second conductive layer 2420, as in FIG. 22. Embodiments of the present invention are not limited to this particular structure. The opening holes 2421 may also be formed as stepped grooves 2421 spaced apart from a surface facing the driving terminal 540 by a predetermined distance.

Through this structure, although not shown, part of the driving terminal 540 that contacts the second conductive layer 1420 may be inserted into the opening holes 2421. Through this structure, as described above, when an ultrasound bonding process of the pad terminal 1400 and the driving terminal 540 is performed, a frictional force between the pad terminal 1400 and the driving terminal 540 may be maximized. Thus, a slip phenomenon that may occur between the pad terminal 1400 and the driving terminal 540 may be minimized.

The second conductive layers 1420 and 2420 of the pad terminals 1400 and 2400 illustrated in FIGS. 22 and 23 may be formed in various shapes. Some of these shapes are shown in the drawings and some are not. As described above, at least one stepped groove, at least one opening hole 1421, or at least one opening hole 2421 may be formed in a surface facing the driving terminal 540 of each of the second conductive layers 1420 and 2420. In this configuration, a frictional force between the driving terminal 540 and the pad terminal 400 may be optimized for the ultrasound bonding process of coupling the driving terminal 540 to the pad terminal 400.

As described above, according to exemplary embodiments of the present invention, a display apparatus in which a pad terminal and a driving terminal can be electrically stably coupled to each other is provided. Additionally, a method of manufacturing the same can be implemented.

It should be understood that while exemplary embodiments of the present invention have been described herein, these exemplary embodiments should be considered descriptive and non-limiting. Descriptions of features or aspects within each exemplary embodiment of the present invention should be considered as available for other similar features or aspects in other exemplary embodiments of the present invention.

While one or more exemplary embodiments of the present invention have been described herein with reference to the figures, it will be understood by those of ordinary skill in the art, that various changes in form and details may be made therein without departing from the spirit and scope of the invention.

What is claimed is:

1. An electronic device including a display apparatus, the display apparatus comprising:
    a display panel including at least one pad terminal disposed thereon;
    a display driver including at least one driving terminal disposed thereon, the driving terminal being connected to the pad terminal;
    a first cutout in the pad terminal or a second cutout in the driving terminal; and
    a connection portion disposed between the pad terminal and the driving terminal, the connection portion including a first material from the pad terminal and a second material from the driving terminal,
    wherein the pad terminal is connected to the driving terminal with the connection portion disposed therebetween.

2. The electronic device of claim 1, wherein the first cutout only partially penetrates the pad terminal or the second cutout only partially penetrates the driving terminal.

3. The electronic device of claim 1, wherein the first cutout fully penetrates the pad terminal or the second cutout fully penetrates the driving terminal.

4. The electronic device of claim 1, wherein when there is a first cutout in the pad terminal, there is also a corresponding first protrusion on the driving, terminal that occupies the first cutout in the pad terminal.

5. The electronic device of claim 4, wherein the first protrusion has a trapezoidal cross-section.

6. The electronic device of claim 4, wherein the first protrusion is disposed, in an edge of the driving terminal or in a center of the driving terminal.

7. The electronic device of claim 1, wherein the first cutout is disposed in an edge of the driving terminal or in a center of the driving terminal.

8. The electronic device of claim 1, wherein the second cutout is disposed in an edge of the pad terminal or in a center of the pad terminal.

\* \* \* \* \*